US012620549B2

(12) United States Patent
Chen et al.

(10) Patent No.: US 12,620,549 B2
(45) Date of Patent: May 5, 2026

(54) DYNAMIC DETERMINATION OF A SAMPLE INSPECTION RECIPE OF CHARGED PARTICLE BEAM INSPECTION

(71) Applicant: ASML Netherlands B.V., Veldhoven (NL)

(72) Inventors: Zhong-wei Chen, San Jose, CA (US); Jack Jau, Los Altos Hills, CA (US); Wei Fang, Milpitas, CA (US); Chiyan Kuan, Danville, CA (US)

(73) Assignee: ASML Netherlands B.V., Veldhoven (NL)

( * ) Notice: Subject to any disclaimer, the term of this patent is extended or adjusted under 35 U.S.C. 154(b) by 964 days.

(21) Appl. No.: 16/652,397

(22) PCT Filed: Sep. 25, 2018

(86) PCT No.: PCT/EP2018/075986
§ 371 (c)(1),
(2) Date: Mar. 30, 2020

(87) PCT Pub. No.: WO2019/063559
PCT Pub. Date: Apr. 4, 2019

(65) Prior Publication Data
US 2020/0286710 A1    Sep. 10, 2020

Related U.S. Application Data

(60) Provisional application No. 62/566,132, filed on Sep. 29, 2017.

(51) Int. Cl.
*H01J 37/28*        (2006.01)
*H01L 21/67*        (2006.01)

(52) U.S. Cl.
CPC ........ *H01J 37/28* (2013.01); *H01L 21/67288* (2013.01); *H01J 2237/24592* (2013.01); *H01J 2237/2817* (2013.01)

(58) Field of Classification Search
CPC .. H01J 37/00; H01J 37/02; H01J 37/26; H01J 37/28; H01J 21/67288; H01J 2237/24592; H01J 2237/2817
(Continued)

(56) References Cited

U.S. PATENT DOCUMENTS 6,943,349 B2    9/2005  Adamec et al.
7,244,949 B2    7/2007  Knippelmeyer et al.
(Continued)

FOREIGN PATENT DOCUMENTS

CN        101025402 A    8/2007
JP      2012-178359 A    9/2012
(Continued)

OTHER PUBLICATIONS

Notification of Reason(s) for Refusal issued in related Korean Patent Application No. 10-2020-7008773; mailed Nov. 3, 2021 (10 pgs.).
(Continued)

*Primary Examiner* — Jason L McCormack
(74) *Attorney, Agent, or Firm* — Finnegan, Henderson, Farabow, Garrett & Dunner, LLP

(57)            ABSTRACT
Disclosed herein is a method comprising: determining parameters of a recipe of charged particle beam inspection of a region on a sample, based on a second set of characteristics of the sample; inspecting the region using the recipe.

15 Claims, 9 Drawing Sheets

100

(58) Field of Classification Search
USPC ......................................... 250/306, 307, 311
See application file for complete search history.

(56) References Cited

U.S. PATENT DOCUMENTS

| | | |
|---|---|---|
| 7,587,704 B2 | 9/2009 | Ye et al. |
| 8,294,095 B2 | 10/2012 | Chen et al. |
| 9,188,554 B2 | 11/2015 | Shishido et al. |
| 9,607,805 B2 | 3/2017 | Liu et al. |
| 2007/0181807 A1 | 8/2007 | Fukuda et al. |
| 2007/0210252 A1 | 9/2007 | Miyamoto et al. |
| 2015/0212019 A1 | 7/2015 | Shishido et al. |
| 2015/0357158 A1* | 12/2015 | Suzuki .................... H01J 37/28 |
| | | 250/307 |
| 2016/0155605 A1 | 6/2016 | Fan et al. |
| 2016/0268096 A1 | 9/2016 | Ren et al. |
| 2016/0284505 A1 | 9/2016 | Ren et al. |
| 2016/0377561 A1* | 12/2016 | Ramachandran .. G01N 21/9501 |
| | | 250/307 |

| | | |
|---|---|---|
| 2017/0025241 A1 | 1/2017 | Li et al. |
| 2017/0025243 A1 | 1/2017 | Ren et al. |
| 2017/0154756 A1 | 6/2017 | Ren et al. |

FOREIGN PATENT DOCUMENTS

| | | |
|---|---|---|
| KR | 10-2016-0003798 A | 1/2016 |
| WO | WO 2017/132435 A1 | 8/2017 |
| WO | WO 2018/122176 A1 | 7/2018 |

OTHER PUBLICATIONS

International Search Report and Written Opinion issued in related PCT International Application No. PCT/EP2018/075986, mailed Dec. 20, 2018 (9 pgs.).

First Office Action from the Patent Office of the People's Republic of China issued in related Chinese Patent Application No. 2018800634304; mailed Mar. 29, 2022 (11 pgs.).

* cited by examiner

DYNAMIC DETERMINATION OF A SAMPLE INSPECTION RECIPE OF CHARGED PARTICLE BEAM INSPECTION

CROSS-REFERENCE TO RELATED APPLICATIONS

This application is a national stage filing under 35 U.S.C. § 371 of International Application No. PCT/EP2018/075986, filed on Sep. 25, 2018, and published as WO 2019/063559 A1, which claims priority of U.S. Provisional Application No. 62/566,132, which was filed on Sep. 29, 2017. The contents of these applications are incorporated herein by reference in their entireties.

TECHNICAL FIELD

This disclosure relates to methods and apparatuses for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is a method comprising: determining parameters of a recipe of charged particle beam inspection of a region on a sample, based on a second set of characteristics of the sample; inspecting the region using the recipe.

According to an embodiment, the second set of characteristics comprises a shape of the sample, a density of the sample, a composition of the sample, or a structure of the sample.

According to an embodiment, the second set of characteristics comprises characteristics of patterns formed in the region.

According to an embodiment, the characteristics of patterns formed in the region comprise design of the patterns.

According to an embodiment, the second set of characteristics comprises characteristics of a process by which patterns in the region are formed.

According to an embodiment, the characteristics of the process comprise parameters of etching, parameters of lithography, or parameters of deposition.

According to an embodiment, the second set of characteristics comprises characteristics of defects in the region.

According to an embodiment, the characteristics of defects comprise existence of defects, density of defects, types of defects, or geometric characteristics of defects.

According to an embodiment, the second set of characteristics comprises characteristics of prior inspections on the region.

According to an embodiment, the characteristics of prior inspections on the region comprise parameters of recipes used in the prior inspections, results of the prior inspections, metrics representing of effectiveness of the prior inspections.

According to an embodiment, the parameters of the recipe are selected from a group consisting of: landing energy of one or more beams of charged particles, current of one or more beams of charged particles, focus of one or more beams of charged particles, scan direction of one or more beams of charged particles, scan speed of one or more beams of charged particles, destigmation of one or more beams of charged particles, type of charged particles of one or more beams of charged particles, averaging of signals recorded using one or more beams of charged particles, spot size of one or more beams of charged particles, magnification, type of signals recorded, acceleration voltage of charged particles of one or more beams of charged particles, and a combination thereof.

According to an embodiment, the method further comprises identifying the region based on a first set of characteristics of the sample.

According to an embodiment, the second set of characteristics and the first set of characteristics have overlap, have no overlap, or are identical.

According to an embodiment, the first set of characteristics comprises design of patterns formed in the region and characteristics of a process by which the patterns in the region are formed; and identifying the region comprises obtaining a simulation result by simulating the patterns based on the design and the characteristics of the process.

According to an embodiment, the simulation result comprises positions or geometric characteristics of the patterns.

According to an embodiment, the simulation result comprises an aerial image, a resist image or an etched image.

According to an embodiment, identifying the region further comprises comparing the simulation result and specifications of the patterns.

According to an embodiment, the first set of characteristics comprises characteristics of a process by which patterns in the region are formed; and identifying the region comprises comparing the characteristics of the process and process windows of the patterns.

According to an embodiment, the first set of characteristics comprises design of patterns formed in the region and characteristics of a process by which the patterns in the region are formed; and identifying the region comprises inputting the first set of characteristics into a machine learning model.

According to an embodiment, the machine learning model is selected from a group consisting of decision trees, ensembles, k-NN, linear regression, naive Bayes, neural networks, logistic regression, perceptron, support vector machine (SVM), relevance vector machine (RVM), and deep learning.

Disclosed herein is a computer program product comprising a non-transitory computer readable medium having instructions recorded thereon, the instructions when executed by a computer implementing any of the above methods.

DETAILED DESCRIPTION

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B.

As a second example, if it is stated that a database can include A, B, or C, then, unless specifically stated otherwise or infeasible, the database can include A, or B, or C, or A and B, or A and C, or B and C, or A and B and C.

Figure 1:
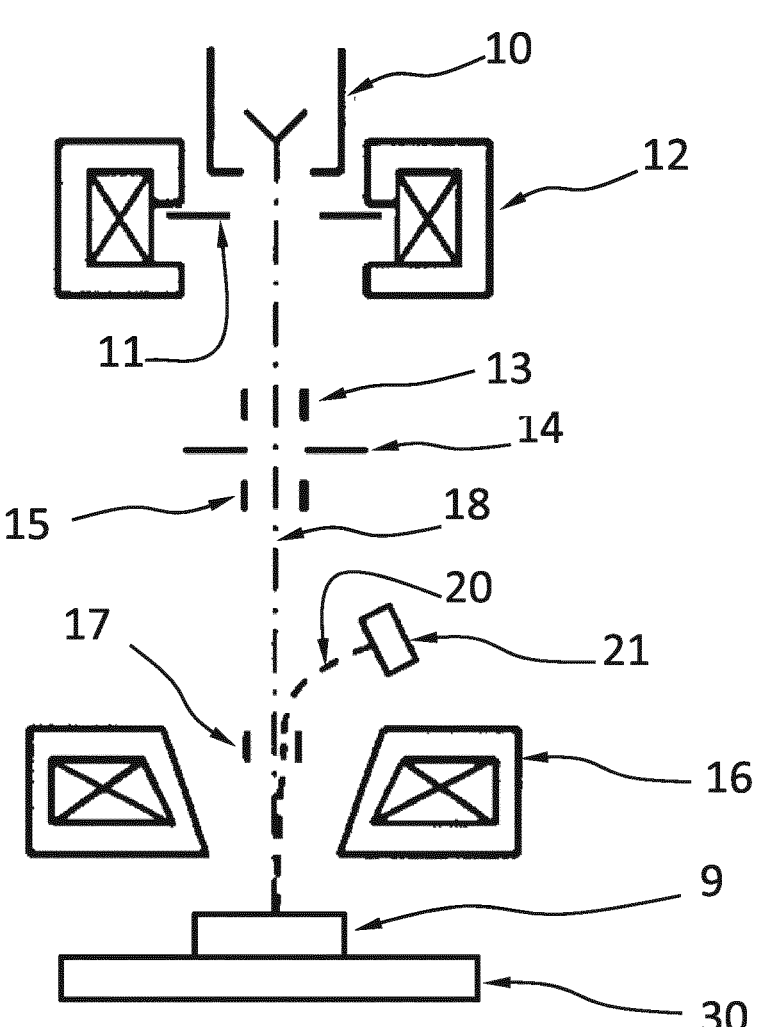
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample, such as an E×B charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the E×B charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used.

In an example, multiple beams of charged particles can simultaneously scan multiple regions on a sample. The scanning of the multiple beams may be synchronized or independent. The multiple regions may have overlaps among them, may be tiled to cover a continuous area, or may be isolated from one another. Signals generated from the interactions of the beams and the sample may be collected by multiple detectors. The number of detectors may be less than, equal to, or greater than the number of the beams. The multiple beams may be individually controlled or collectively controlled.

Multiple beams of charged particles may form multiple probe spots on a surface of a sample. The probe spots can respectively or simultaneously scan multiple regions on the surface. The charged particles of the beams may generate signals from the locations of the probe spots. One example of the signals is secondary electrons. Secondary electrons usually have energies less than 50 eV. Another example of the signals is backscattered electrons when the charged particles of the beams are electrons. Backscattered electrons usually have energies close to landing energies of the electrons of the beams. The signals from the locations of the probe spots may be respectively or simultaneously collected by multiple detectors.

The multiple beams may be from multiple sources respectively, or from a single source. If the beams are from multiple sources, multiple columns may scan and focus the beams onto the surface, and the signals generated by the beams may be detected by detectors in the columns, respectively. An apparatus using beams from multiple sources may be called as a multi-column apparatus. The columns can be either independent or share a multi-axis magnetic or electromagnetic-compound objective lens. See U.S. Pat. No. 8,294,095, whose disclosure is hereby incorporated by reference in its entirety. The probe spots generated by a multi-column apparatus may be spaced apart by a distance as large as 30-50 mm.

If the beams are from a single source, a source-conversion unit may be used to form multiple virtual or real images of the single source. Each of the images and the single source may be viewed as an emitter of a beam (also called a "beamlet" as all of the beamlets are from the same source). The source-conversion unit may have an electrically conductive layer with multiple openings that can divide the charged particles from the single source into multiple beamlets. The source-conversion unit may have optics elements that can influence the beamlets to form multiple virtual or real images of the single source. Each of the images can be viewed as a source that emits one of the beamlets. The beamlets may be spaced apart by a distance of micrometers. A single column, which may have a projection system and a deflection scanning unit, may be used to scan and focus the beamlets on multiple regions of a sample. The signals generated by the beamlets may be respectively detected by multiple detection elements of a detector inside the single column. An apparatus using beams from a single source may be called as a multi-beam apparatus.

There are at least two methods to form the images of the single source. In the first method, each optics element has an electrostatic micro-lens that focuses one beamlet and thereby forms one real image. See, e.g., U.S. Pat. No. 7,244,949, whose disclosure is hereby incorporated by reference in its entirety. In the second method, each optics element has an electrostatic micro-deflector which deflects one beamlet thereby forms one virtual image. See, e.g., U.S. Pat. No. 6,943,349 and U.S. patent application Ser. No. 15/065,342, whose disclosures are hereby incorporated by reference in their entirety. Interactions (e.g., the Coulomb effect) among the charged particles in the second method may be weaker than that in the first method because a real image has a higher current density.

Figure 2A:
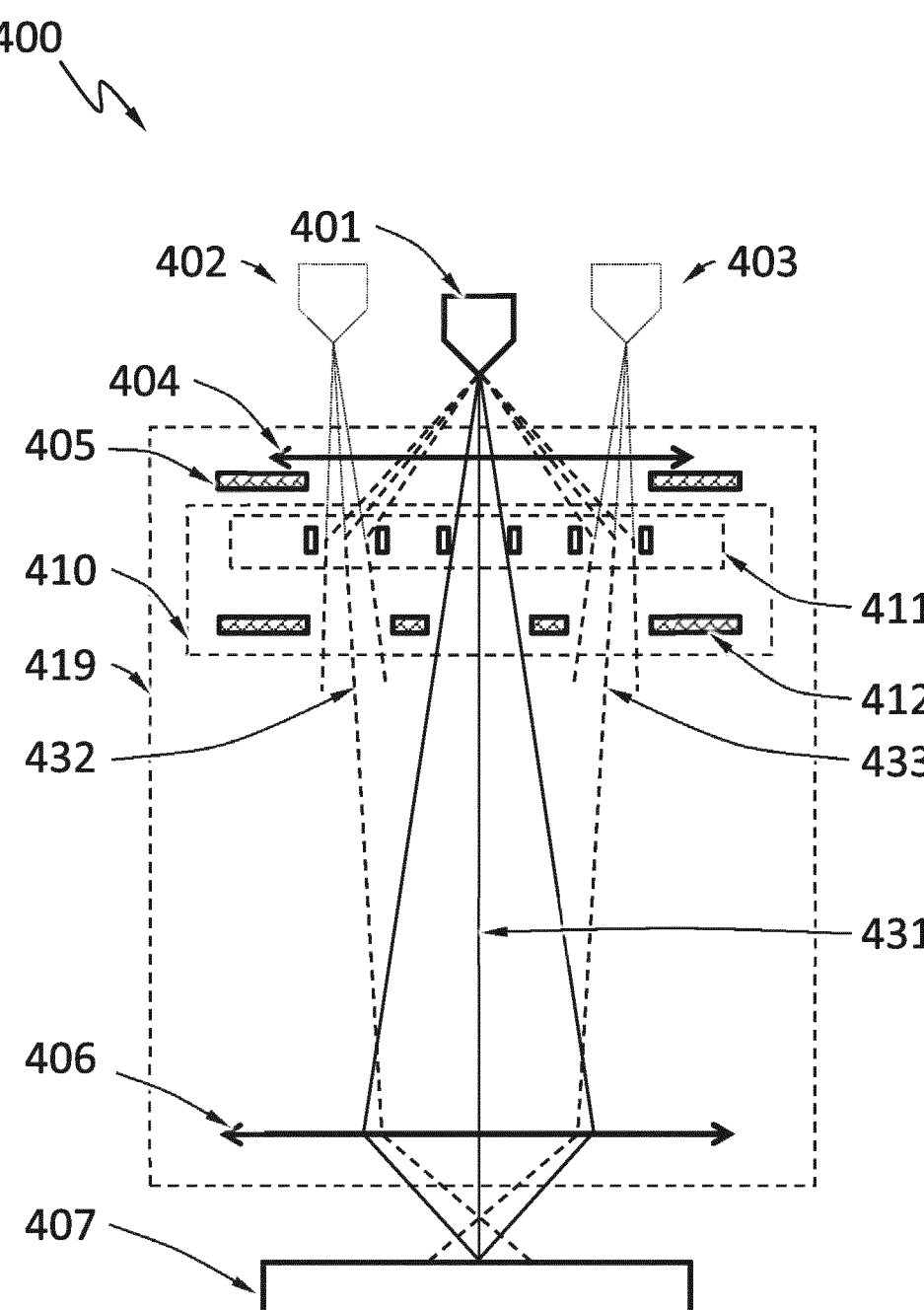
FIG. 2A schematically shows an apparatus that can carry out charged particle beam inspection using multiple beams of charge particles, where the charged particles in the multiple beams are from a single source (a "multi-beam" apparatus).

FIG. 2A schematically shows an apparatus 400 that can carry out charged particle beam inspection using multiple beams of charge particles, where the charged particles in the multiple beams are from a single source. Namely, the apparatus 400 is a multi-beam apparatus. The apparatus 400 has a source 401 that can produce charged particles in free space. In an example, the charged particles are electrons and the source 401 is an electron gun. The apparatus 400 has an optics system 419 that can generate with the charged particles multiple probe spots on a surface of a sample 407 and scan the probe spots on the surface of the sample 407. The optics system 419 may have a condenser lens 404 and a main aperture 405 upstream or downstream with respect to the condenser lens 404. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The optics system 419 has a source-conversion unit 410 configured to form multiple virtual images (e.g., virtual images 402 and 403) of the source 401. The virtual images and the source 401 each can be viewed as an emitter of a beamlet (e.g., beamlets 431, 432 and 433). The source-conversion unit 410 may have an electrically conductive layer 412 with multiple openings that can divide the charged particles from the source 401 into multiple beamlets, and optics elements 411 that can influence the beamlets to form the virtual images of the source 401. The optics elements 411 may be micro-deflectors configured to deflect the beamlets. The electric current of the beamlets may be affected by the sizes of the openings in the electrically conductive layer 412 or the focusing power of the condenser lens 404. The optics system 419 includes an objective lens 406 configured to focus the multiple beamlets and thereby form multiple probe spots onto the surface of the sample 407. The source-conversion unit 410 may also have micro-compensators configured to reduce or eliminate aberrations (e.g., field curvature and astigmatism) of the probe spots.

Figure 2B:
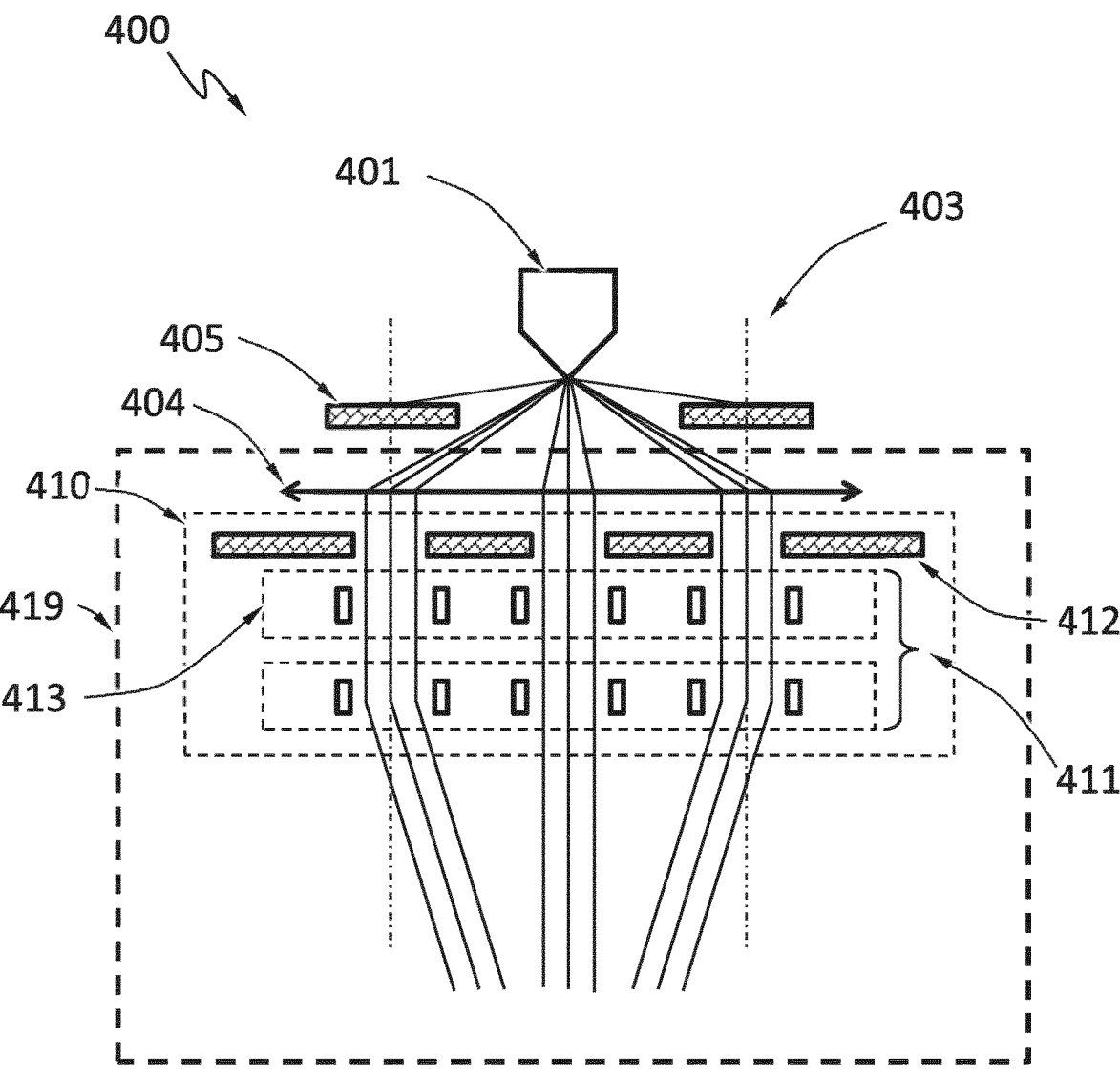
FIG. 2B schematically shows an alternative multi-beam apparatus.

FIG. 2B schematically shows an alternative multi-beam apparatus. The condenser lens 404 collimates the charged particles from the source 401. The optics elements 411 of the source-conversion unit 410 may comprise micro-compensators 413. The micro-compensators 413 may be separate from micro-deflectors or may be integrated with micro-deflectors. If separated, the micro-compensators 413 may be positioned upstream to the micro-deflectors. The micro-compensators 413 are configured to compensate for off-axis aberrations (e.g., field curvature, astigmatism and distortion) of the condenser lens 404 or the objective lens 406. The off-axis aberrations may negatively impact the sizes or positions of the probe spots formed by off-axis (i.e., being not along the primary optical axis of the apparatus) beamlets. The off-axis aberrations of the objective lens 406 may not be completely eliminated by deflection of the beamlets. The micro-compensators 413 may compensate for the residue off-axis aberrations (i.e., the portion of the off-axis aberrations that cannot be eliminated by deflection of the beamlets) of the objective lens 406, or non-uniformity of the sizes of the probe spots. Each of the micro-compensators 413 is aligned with one of the openings in the electrically conductive layer 412. The micro-compensators 413 may each have four or more poles. The electric currents of the beamlets may be affected by the sizes of the openings in the electrically conductive layer 412 and/or the position of the condenser lens 404.

Figure 2C:
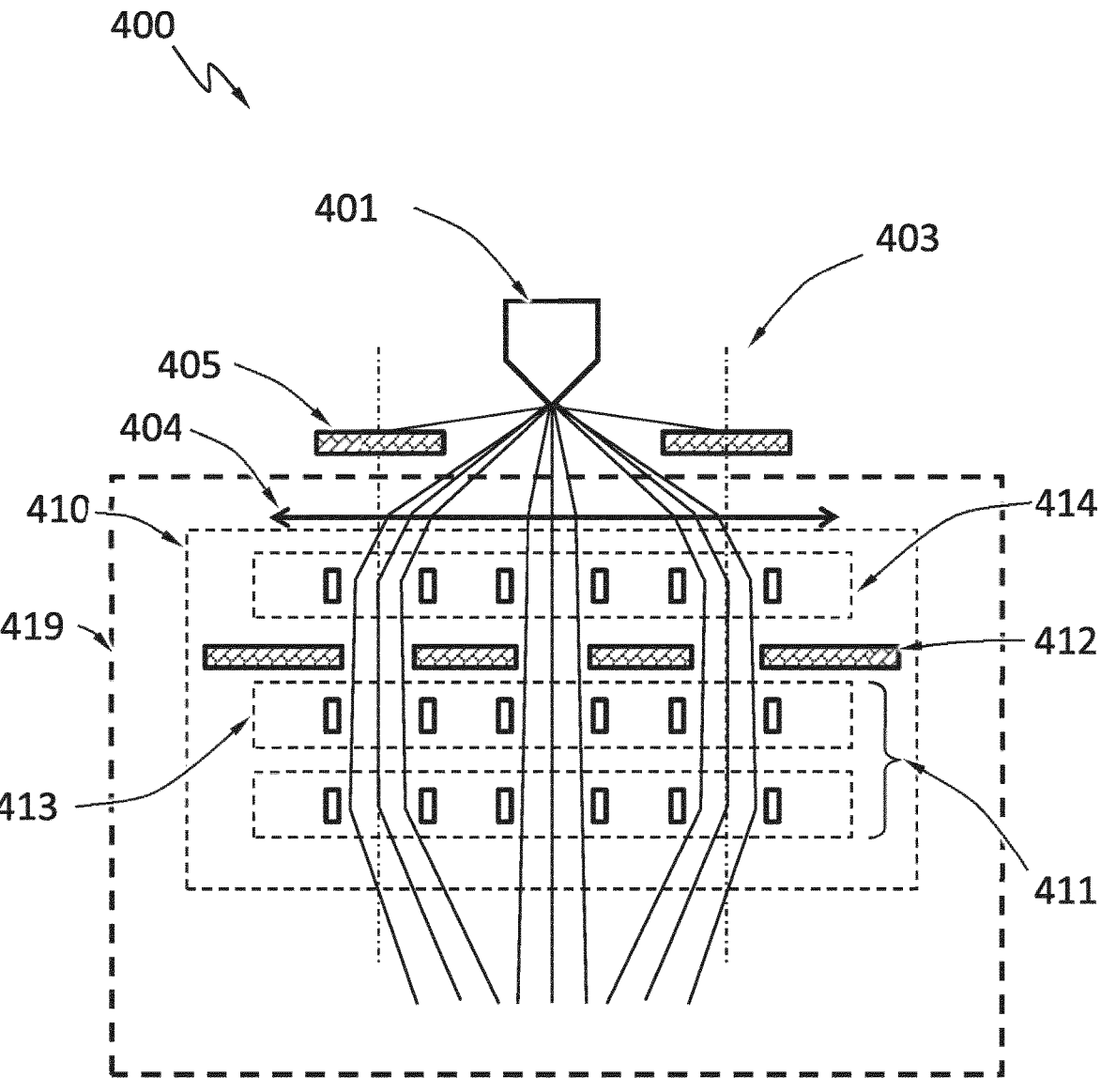
FIG. 2C schematically shows an alternative multi-beam apparatus.

FIG. 2C schematically shows an alternative multi-beam apparatus. The optics elements 411 of the source-conversion unit 410 may comprise pre-bending micro-deflectors 414. The pre-bending micro-deflectors 414 are micro-deflectors configured to bend the beamlets before they go through the openings in the electrically conductive layer 412.

Additional descriptions of apparatuses using multiple beams of charge particles from a single source may be found in U.S. Patent Application Publications 2016/0268096, 2016/0284505 and 2017/0025243, U.S. Pat. No. 9,607,805, U.S. patent application Ser. Nos. 15/365,145, 15/213,781, 15/216,258 and 62/440,493, and PCT Application PCT/US17/15223, the disclosures of which are hereby incorporated by reference in their entirety.

Charged particle beam inspection may be adjusted in many ways. The collection of the values of the adjustable parameters for the inspection may be called a recipe. Examples of the parameters at least may include landing energy of one or more beams of charged particles, current of one or more beams of charged particles, focus of one or more beams of charged particles, scan direction of one or more beams of charged particles, scan speed of one or more beams of charged particles, destigmation of one or more beams of charged particles, type of charged particles of one or more beams of charged particles, averaging of signals recorded using one or more beams of charged particles, spot size of one or more beams of charged particles, magnification, type of signals recorded, and acceleration voltage of charged particles of one or more beams of charged particles.

The effectiveness of the recipe may depend on characteristics of the region being inspected on the sample. Examples of the characteristics of the sample at least may include a shape of the sample, a density of the sample, a composition of the sample, a structure of the sample, characteristics of patterns formed in the region, characteristics of a process by which patterns in the region are formed, characteristics of defects in the region, and characteristics of prior inspections on the region. Examples of the characteristics of defects in the region may include existence of defects in the region, density of defects in the region, types of defects in the region, and geometric characteristics of defects in the region. Examples of the characteristics of the process by which the patterns in the region are formed at least may include parameters of etching, parameters of lithography, and parameters of deposition. Examples of the characteristics of prior inspections on the region may include parameters of recipes used in the prior inspections, results of the prior inspections, metrics representing of effectiveness of the prior inspections. The recipe suitable for different regions of the sample may be different. Therefore, determining the recipe (i.e., the values of the parameters in the recipe) based on the characteristics of the region may improve the effectiveness of the inspection.

Figure 3:
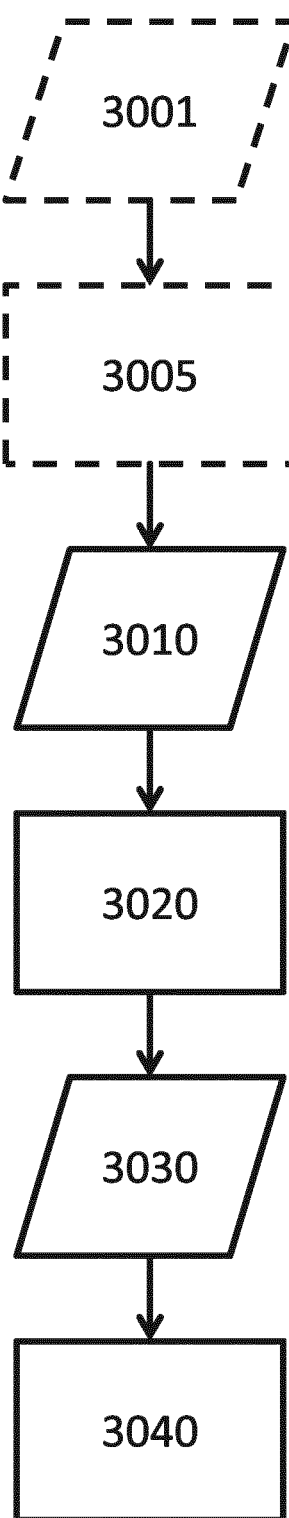
FIG. 3 schematically shows a flowchart for a method of determining a recipe 3030 for charged particle beam inspection, according to an embodiment.

FIG. 3 schematically shows a flowchart for a method of determining a recipe 3030 of charged particle beam inspection, according to an embodiment. In optional step 3005, a region to be inspected is identified on a sample, based on a first set of characteristics 3001 of the sample. The first set of characteristics 3001 may include characteristics of patterns in the region (e.g., the design of the patterns) or characteristics of the process conditions of the patterns (i.e., conditions under which the patterns are formed in the region). In step 3020, the parameters of the recipe 3030 are determined based on a second set of characteristics 3010 of the sample. The second set of characteristics 3010 and the first set of characteristics 3001 may have some overlap (i.e., the intersection of the first set and the second set is not empty), no overlap (i.e., the intersection of the first set and the second set is empty), or be identical. In an example, the second set of characteristics 3010 contains characteristics of defects in the region. Instances of the characteristics of defects may include existence of defects, density of defects, types of defects, and geometric characteristics of defects. In step 3040, the region is inspected using the recipe 3030. Namely, the region is inspected with the parameters thereof being at the values of these parameters in the recipe 3030.

Figure 4:
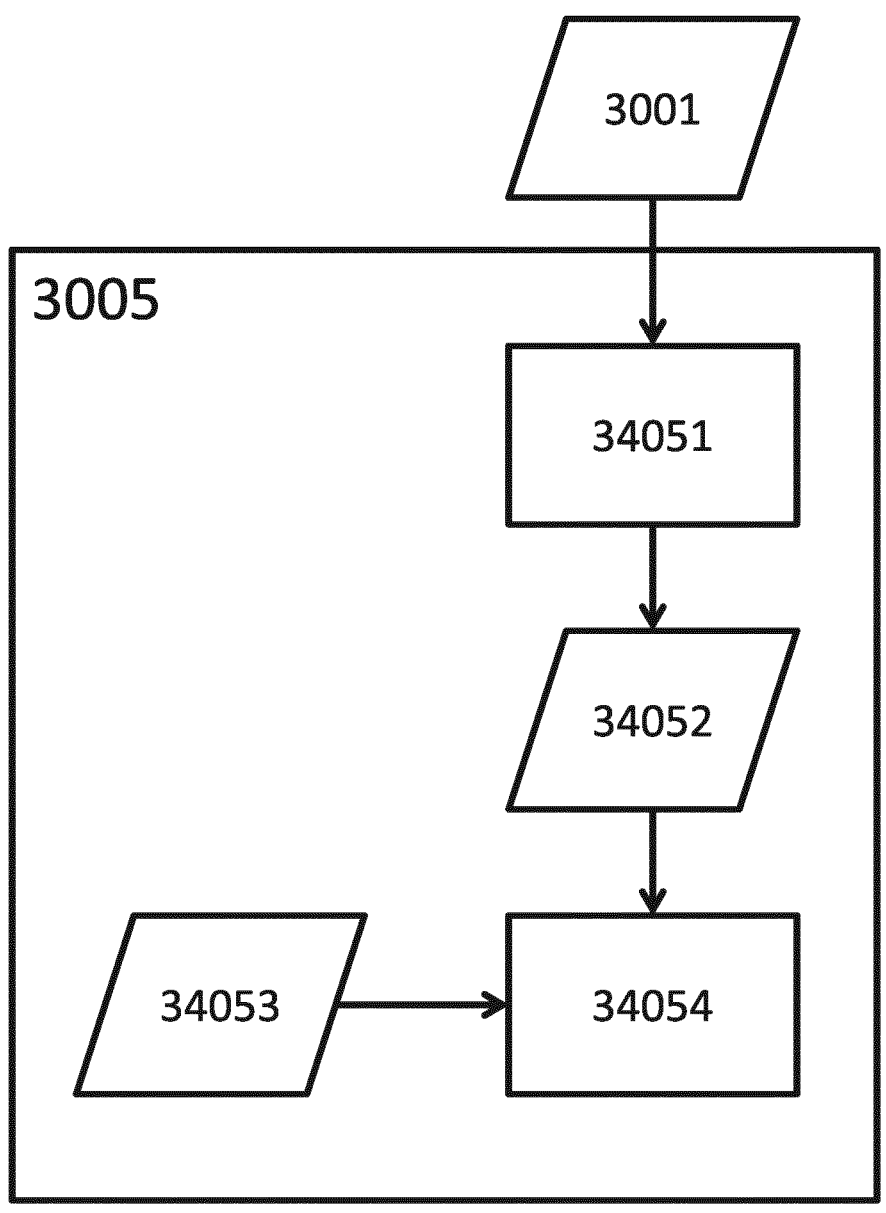
FIG. 4 schematically shows a flowchart for optional step 3005 in the flowchart of FIG. 3, according to an embodiment.

FIG. 4 schematically shows a flowchart for optional step 3005 in the flowchart of FIG. 3, according to an embodiment. In this embodiment, the first set of characteristics 3001 includes the design of the patterns (e.g., as represented in one or more GDS files) in a region and characteristics of the process conditions of the patterns (i.e., conditions under which the patterns are formed). In step 34051, the patterns are simulated using a model, based on the design of the patterns and the characteristics of the process conditions. The simulation result 34052 may include the positions and geometric characteristics (e.g., shapes, sidewall angles, line roughness) of the patterns. In step 34054, the simulation result 34052 and specifications 34053 of the patterns are compared and whether the region is a region to be inspected is determined based on the comparison. For example, if the edge positions of a pattern as simulated are too far off from the edge positions as prescribed in the specification, the pattern may likely be a defect and the region containing this pattern may be inspected.

Figure 5:
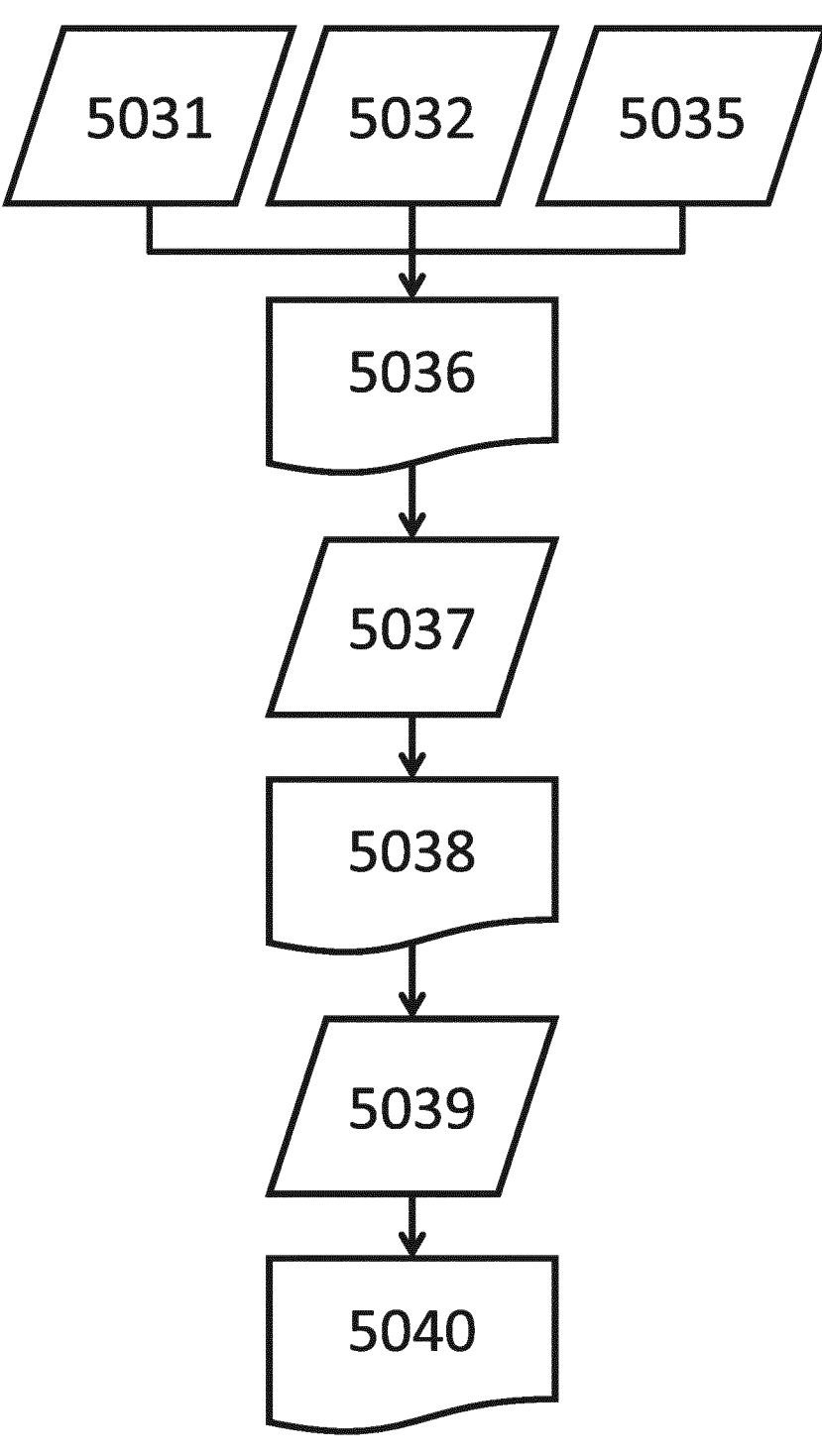
FIG. 5 schematically shows a simulation flow chart, which may be used in step 34051 in FIG. 4.

FIG. 5 schematically shows a simulation flow chart, which may be used in step 34051 in FIG. 4. A source model 5031 represents optical characteristics (including radiation intensity distribution and/or phase distribution) of a radiation source of a lithographic apparatus that may be used to form the patterns into the region. A projection optics model 5032 represents optical characteristics (including changes to the radiation intensity distribution and/or the phase distribution caused by the projection optics) of projection optics of the lithographic apparatus. A patterning device model 5035 represents optical characteristics of the patterning device (including changes to the radiation intensity distribution and/or the phase distribution caused by a given design layout represented on the patterning device) to be used to form the patterns into the region. An aerial image 5036 of the patterns can be simulated from the source model 5031, the projection optics model 5032 and the patterning device model 5035. A resist image 5038 of the patters can be simulated from the aerial image 5036 using a resist model 5037. The resist model 5037 represents physical and chemical properties of the resist (e.g., behavior of the resist in exposure, PEB and development) on the sample. An etch image 5040 of the patters can be simulated from the resist image 5038 using an etching model 5039. The etching model 5039 represents characteristics of the etching process to form the patterns.

More specifically, the source model 5031 can represent the optical characteristics of the source that include, but not limited to, numerical aperture settings, illumination sigma ($\sigma$) settings as well as any particular illumination shape (e.g. off-axis radiation sources such as annular, quadrupole, dipole, etc.). The projection optics model 5032 can represent the optical characteristics of the projection optics, including aberration, distortion, one or more refractive indexes, one or more physical sizes, one or more physical dimensions, etc. The patterning device model 5035 can represent one or more physical properties of a physical patterning device, as described, for example, in U.S. Pat. No. 7,587,704, which is incorporated by reference in its entirety. The etching model 5039 can represent characteristics of the etching process such as the gas composition, microwave power, duration, materials of the substrate, etc.

The simulation does not have to simulate a portion of the aerial, resist or etched image; it can simulate various characteristics thereof. For example, the simulation may simulate geometrical characteristics of patterns in the aerial, resist or etched image.

Figure 6:
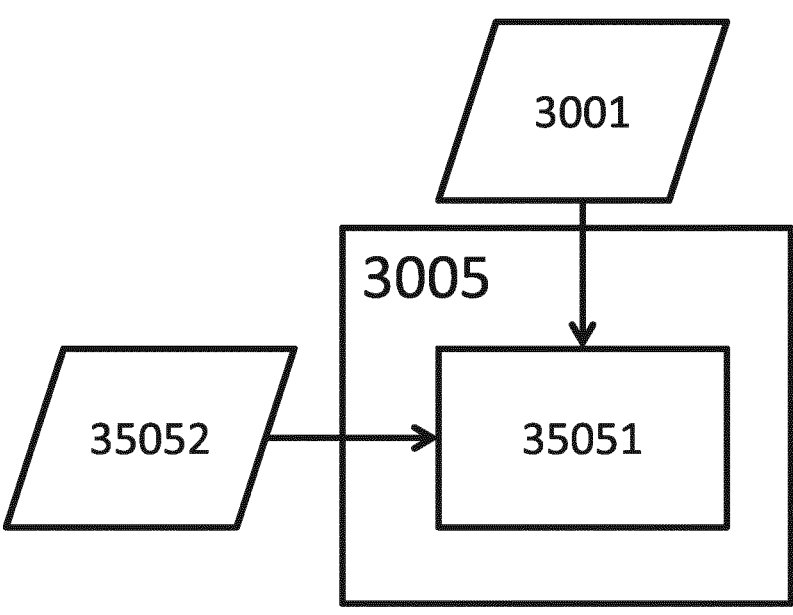
FIG. 6 schematically shows a flowchart for optional step 3005 in the flowchart of FIG. 3, according to an embodiment.

FIG. 6 schematically shows a flowchart for optional step 3005 in the flowchart of FIG. 3, according to an embodiment. In this embodiment, the first set of characteristics 3001 includes characteristics of the process conditions of the patterns (i.e., conditions under which the patterns are formed) in a region. In step 35051, the characteristics of the process conditions and the process windows 35052 of the patterns are compared and whether the region is a region to be inspected is determined based on the comparison. For example, if the process condition of one of the patterns is outside the process window of that pattern, that pattern may likely be a defect and the region containing this pattern may be inspected. The process window of a pattern is a space of the process parameters under which the pattern will be produced within the specification. From a mathematical point of view, a process window is a portion of a vector space spanned by all the process parameters. In a given lithography process, the process window of a pattern is dictated only by the specification of the pattern and the physics involved in the lithography process. Namely, if the specification and the physics do not change during the lithography process, the process window does not change.

Figure 7:
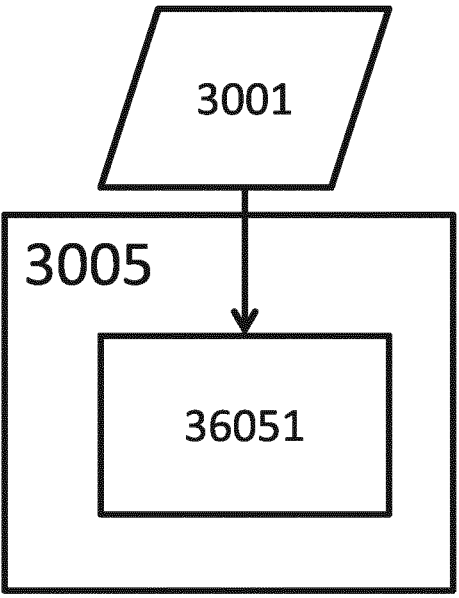
FIG. 7 schematically shows a flowchart for optional step 3005 in the flowchart of FIG. 3, according to an embodiment.

FIG. 7 schematically shows a flowchart for optional step 3005 in the flowchart of FIG. 3, according to an embodiment. In this embodiment, the first set of characteristics 3001 includes the design of the patterns (e.g., as represented in one or more GDS files) in a region and characteristics of the process conditions of the patterns (i.e., conditions under which the patterns are formed). In step 36051, the first set of characteristics 3001 are input into a machine learning model 36051. The machine learning model 36051 determines whether or the probability that the patterns are defects, and whether the region is a region to be inspected. For example, if the region contains a defect or has a high probability of containing a defect, the region may be inspected. Examples of a machine learning model include decision trees, ensembles (bagging, boosting, random forest), k-NN, linear regression, naive Bayes, neural networks, logistic regression, perceptron, support vector machine (SVM), relevance vector machine (RVM), and deep learning model.

The embodiments may further be described using the following clauses:

1. A method comprising:
    determining parameters of a recipe of charged particle beam inspection of a region on a sample, based on a second set of characteristics of the sample;
    inspecting the region using the recipe.
2. The method of clause 1, wherein the second set of characteristics comprises a shape of the sample, a density of the sample, a composition of the sample, or a structure of the sample.
3. The method of clause 1, wherein the second set of characteristics comprises characteristics of patterns formed in the region.
4. The method of clause 3, wherein the characteristics of patterns formed in the region comprise design of the patterns.
5. The method of clause 1, wherein the second set of characteristics comprises characteristics of a process by which patterns in the region are formed.
6. The method of clause 5, wherein the characteristics of the process comprise parameters of etching, parameters of lithography, or parameters of deposition.
7. The method of clause 1, wherein the second set of characteristics comprises characteristics of defects in the region.
8. The method of clause 7, wherein the characteristics of defects comprise existence of defects, density of defects, types of defects, or geometric characteristics of defects.
9. The method of clause 1, wherein the second set of characteristics comprises characteristics of prior inspections on the region.
10. The method of clause 9, wherein the characteristics of prior inspections on the region comprise parameters of recipes used in the prior inspections, results of the prior inspections, metrics representing of effectiveness of the prior inspections.
11. The method of clause 1, wherein the parameters of the recipe are selected from a group consisting of:
    landing energy of one or more beams of charged particles, current of one or more beams of charged particles,
    focus of one or more beams of charged particles,
    scan direction of one or more beams of charged particles,
    scan speed of one or more beams of charged particles, destigmation of one or more beams of charged particles,
    type of charged particles of one or more beams of charged particles,
    averaging of signals recorded using one or more beams of charged particles,
    spot size of one or more beams of charged particles,
    magnification,
    type of signals recorded,
    acceleration voltage of charged particles of one or more beams of charged particles, and
    a combination thereof.
12. The method of clause 1, further comprising identifying the region based on a first set of characteristics of the sample.
13. The method of clause 12, wherein the second set of characteristics and the first set of characteristics have overlap, have no overlap, or are identical.
14. The method of clause 12, wherein the first set of characteristics comprises design of patterns formed in the region and characteristics of a process by which the patterns in the region are formed;
    wherein identifying the region comprises obtaining a simulation result by simulating the patterns based on the design and the characteristics of the process.
15. The method of clause 14, wherein the simulation result comprises positions or geometric characteristics of the patterns.
16. The method of clause 14, wherein the simulation result comprises an aerial image, a resist image or an etched image.
17. The method of clause 12, wherein identifying the region further comprises comparing the simulation result and specifications of the patterns.
18. The method of clause 12, wherein the first set of characteristics comprises characteristics of a process by which patterns in the region are formed;
    wherein identifying the region comprises comparing the characteristics of the process and process windows of the patterns.
19. The method of clause 12, wherein the first set of characteristics comprises design of patterns formed in the region and characteristics of a process by which the patterns in the region are formed;
    wherein identifying the region comprises inputting the first set of characteristics into a machine learning model.
20. The method of clause 19, wherein the machine learning model is selected from a group consisting of decision trees, ensembles, k-NN, linear regression, naive Bayes, neural networks, logistic regression, perceptron, support vector machine (SVM), relevance vector machine (RVM), and deep learning.
21. A computer program product comprising a non-transitory computer readable medium having instructions recorded thereon, the instructions when executed by a computer implementing the method of any of clauses 1 through 20.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:

identifying a region based on a first set of characteristics of a sample, wherein the first set of characteristics comprises characteristics of a process by which patterns in the region are formed, wherein the identifying the region comprises comparing the characteristics of the process and process windows of the patterns; and determining parameters of a recipe of charged particle beam inspection of the region on the sample, based on a second set of characteristics of the sample; and inspecting the region using the recipe.

2. The method of claim 1, wherein the second set of characteristics comprises a shape of the sample, a density of the sample, a composition of the sample, or a structure of the sample.

3. The method of claim 1, wherein the second set of characteristics comprises characteristics of patterns formed in the region.

4. The method of claim 3, wherein the characteristics of patterns formed in the region comprise design of the patterns.

5. The method of claim 1, wherein the second set of characteristics comprises characteristics of a process by which patterns in the region are formed.

6. The method of claim 5, wherein the characteristics of the process comprise parameters of etching, parameters of lithography, or parameters of deposition.

7. The method of claim 1, wherein the second set of characteristics comprises characteristics of defects in the region.

8. The method of claim 7, wherein the characteristics of defects comprise existence of defects, density of defects, types of defects, or geometric characteristics of defects.

9. The method of claim 1, wherein the second set of characteristics comprises characteristics of prior inspections on the region.

10. The method of claim 9, wherein the characteristics of prior inspections on the region comprise parameters of recipes used in the prior inspections, results of the prior inspections, metrics representing of effectiveness of the prior inspections.

11. The method of claim 1, wherein the parameters of the recipe are any of:

landing energy of one or more beams of charged particles, current of one or more beams of charged particles, focus of one or more beams of charged particles, scan direction of one or more beams of charged particles, scan speed of one or more beams of charged particles, destigmation of one or more beams of charged particles, type of charged particles of one or more beams of charged particles, averaging of signals recorded using one or more beams of charged particles, spot size of one or more beams of charged particles, magnification, type of signals recorded, or acceleration voltage of charged particles of one or more beams of charged particles.

12. The method of claim 1 wherein identifying the region further comprises obtaining a simulation result by simulating the patterns based on the design and the characteristics of the process.

13. A method comprising:

identifying a region based on a first set of characteristics of a sample, wherein the first set of characteristics comprises characteristics of the process by which the patterns in the region are formed, wherein the identifying the region comprises obtaining a simulation result by simulating the patterns based on the design and the characteristics of the process; and determining parameters of a recipe of charged particle beam inspection of the region on the sample, based on a second set of characteristics of the sample and inspecting the region using the recipe.

14. The method of claim 13, wherein the second set of characteristics comprises characteristics of defects in the region.

15. A computer program product comprising a non-transitory computer readable medium having instructions recorded thereon, the instructions when executed by a computer implementing the method of claim 1 or claim 13.

\* \* \* \* \*